(12) United States Patent
Matsushita et al.

(10) Patent No.: US 8,169,288 B2
(45) Date of Patent: May 1, 2012

(54) ELECTRONIC COMPONENT AND METHOD FOR MAKING THE SAME

(75) Inventors: Yosuke Matsushita, Nagaokakyo (JP); Tetsuo Taniguchi, Nagaokakyo (JP); Masahiro Teramoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/180,666

(22) Filed: Jul. 12, 2011

(65) Prior Publication Data

US 2011/0267166 A1 Nov. 3, 2011

Related U.S. Application Data

(63) Continuation of application No. PCT/JP2010/050266, filed on Jan. 13, 2010.

(30) Foreign Application Priority Data

Jan. 14, 2009 (JP) .................................. 2009-005317

(51) Int. Cl.
*H01F 5/00* (2006.01)
(52) U.S. Cl. ......................................................... 336/200
(58) Field of Classification Search .................. 336/65, 336/83, 192, 200, 206–208, 232
See application file for complete search history.

(56) References Cited

U.S. PATENT DOCUMENTS

| | | | | |
|---|---|---|---|---|
| 7,453,343 | B2 * | 11/2008 | Ito et al. | 336/200 |
| 7,772,956 | B2 * | 8/2010 | Toi et al. | 336/200 |
| 2003/0076211 | A1 | 4/2003 | Matsuta et al. | |

FOREIGN PATENT DOCUMENTS

| | | |
|---|---|---|
| JP | 05-036533 A | 2/1993 |
| JP | 10-242599 A | 9/1998 |
| JP | 10-303027 A | 11/1998 |
| JP | 2003-133135 A | 5/2003 |
| JP | 2004-327612 A | 11/2004 |
| JP | 2006-140431 A | 6/2006 |

OTHER PUBLICATIONS

Official Communication issued in International Patent Application No. PCT/JP2010/050266, mailed on Apr. 20, 2010.

* cited by examiner

*Primary Examiner* — Tuyen Nguyen
(74) *Attorney, Agent, or Firm* — Keating & Bennett, LLP

(57) ABSTRACT

An electronic component that reduces resistance and prevents occurrence of an edge effect, includes a laminated body formed by stacking insulator layers. Conductor layers are linear conductors, and define coils included in the laminated body. The conductor layers face each other, with the insulator layer interposed therebetween, and allow signals of substantially the same phase to pass therethrough. The conductor layers define regions, each having a shape which decreases in thickness in the z-axis direction with increasing distance from a center thereof in a line width direction.

12 Claims, 6 Drawing Sheets

ELECTRONIC COMPONENT AND METHOD FOR MAKING THE SAME

BACKGROUND OF THE INVENTION

1. Field of the Invention

The present invention relates to an electronic component and a method for making the electronic component. In particular, the present invention relates to an electronic component including coils and a method for making the electronic component.

2. Description of the Related Art

A high-frequency coil described in Japanese Unexamined Patent Application Publication No. 5-36533 includes a helical coil in a multilayer substrate. The helical coil is formed by connecting a plurality of coil patterns. The coil patterns are composed of more than one set of two coil patterns having the same shape. The two coil patterns having the same shape are connected in parallel such that they are at the same potential. This reduces resistance of the helical coil.

In the high-frequency coil described above, the coil patterns are rectangular in cross section. Applying a high-frequency signal to the coil patterns of rectangular cross section causes an edge effect in which a magnetic flux generated around the coil patterns is concentrated at corners and edges of the coil patterns. If an edge effect occurs, a current is concentrated at corners and edges of the coil patterns, and does not flow uniformly over the entire cross sections of the coil patterns. This increases actual resistance of the coil patterns, and leads to an increase in resistance loss.

SUMMARY OF THE INVENTION

Accordingly, preferred embodiments of the present invention provide an electronic component that reduce resistance and prevent the occurrence of an edge effect, and also provide a method for making the electronic component.

An electronic component according to a preferred embodiment of the present invention includes a laminated body including stacked insulator layers, and a plurality of coil conductors defined by linear conductors and arranged to define coils in the laminated body. The plurality of coil conductors that face each other, with at least one insulator layer interposed therebetween, and allow signals of substantially the same phase to pass therethrough, are arranged to define at least one region in a cross section that is perpendicular or substantially perpendicular to a direction in which the linear conductors extend. The one region has a shape which decreases in thickness in a stacking direction with increasing distance from a center thereof in a line width direction.

A method for making an electronic component according to another preferred embodiment of the present invention includes the steps of preparing a first insulator layer and a second insulator layer; forming a first coil conductor and a second coil conductor on the first insulator layer and the second insulator layer, respectively, the first coil conductor and the second coil conductor being linear conductors and, in a cross section perpendicular or substantially perpendicular to a direction in which the linear conductors extend, each having a cross-sectional structure which decreases in thickness in a stacking direction with increasing distance from a center thereof in a line width direction; planarizing a principal surface of the first insulator layer including the first coil conductor thereon by applying an insulator layer to the principal surface; and stacking the second insulator layer on the first insulator layer such that the first coil conductor and the second coil conductor coincide with each other in plan view as viewed in the stacking direction.

A method for making an electronic component according to a further preferred embodiment of the present invention includes the steps of preparing a first insulator layer and a second insulator layer; forming a first coil conductor and a second coil conductor on the first insulator layer and the second insulator layer, respectively, the first coil conductor and the second coil conductor being linear conductors; forming an intermediate layer at a center of the second coil conductor in a line width direction; and stacking the second insulator layer on the first insulator layer such that the first coil conductor and the second coil conductor coincide with each other in plan view as viewed in a stacking direction.

According to various preferred embodiments of the present invention, it is possible to reduce resistance of coils and prevent the occurrence of an edge effect.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

An electronic component and a method for making the electronic component according to preferred embodiments of the present invention will now be described. The electronic component is, for example, a high-frequency filter including coils and capacitors.

First Preferred Embodiment

Figure 1:
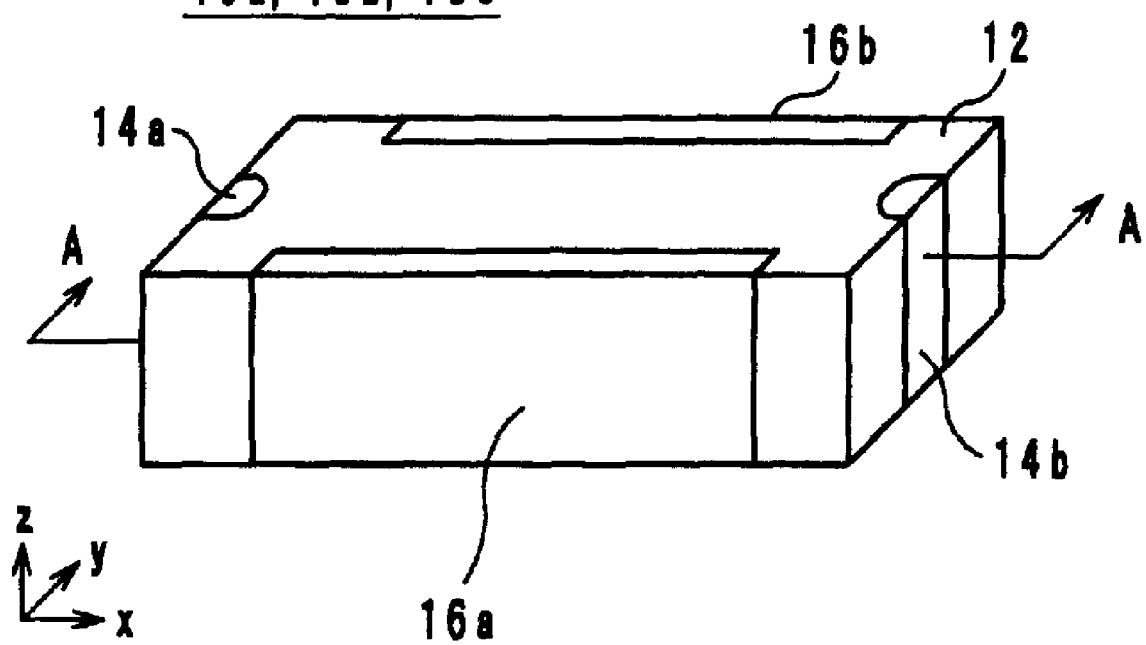
FIG. 1 is an external perspective view of an electronic component according to a preferred embodiment of the present invention.
Figure 2:
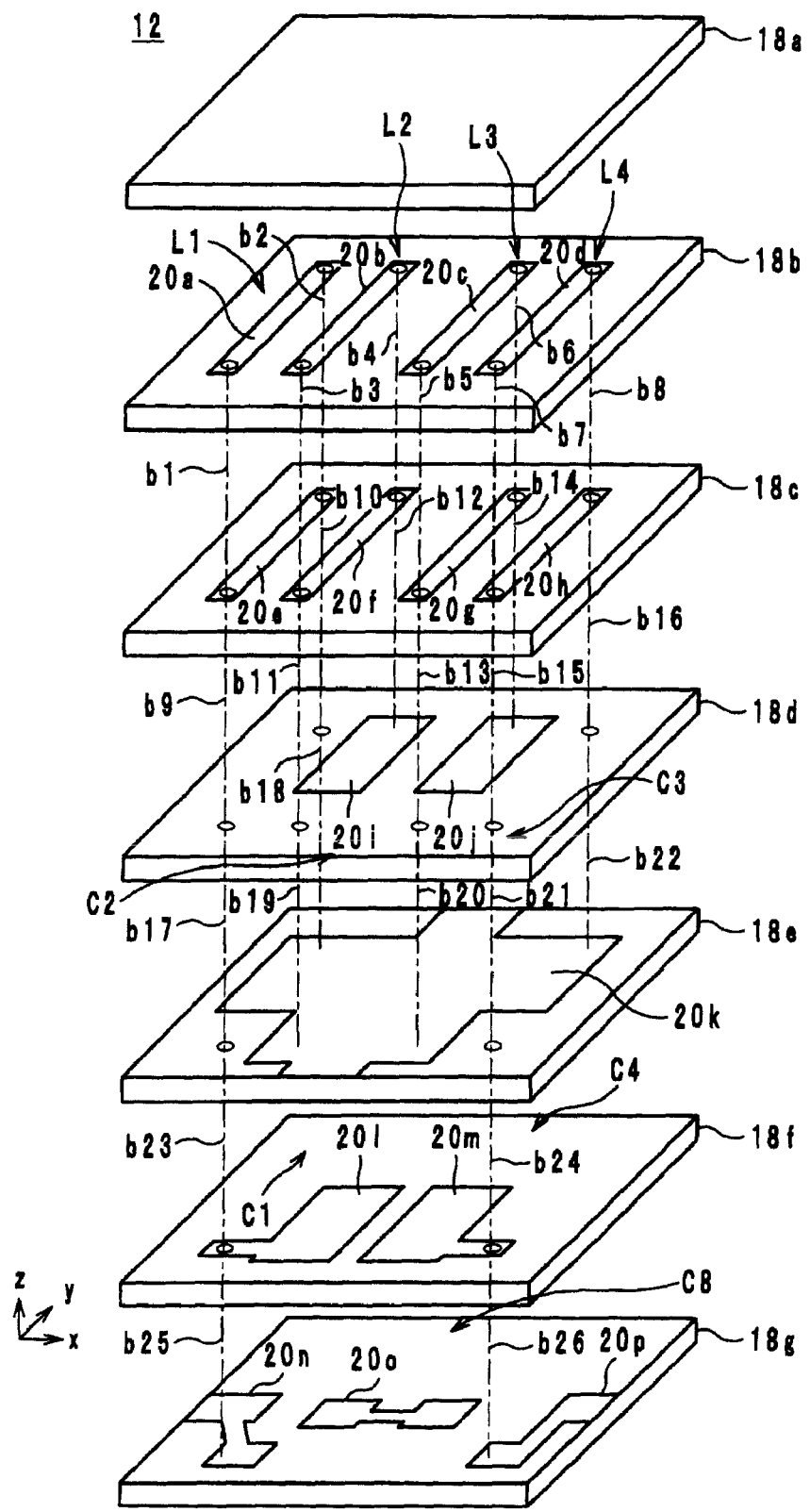
FIG. 2 is an exploded perspective view illustrating a laminated body of an electronic component according to a preferred embodiment of the present invention.
Figure 3:
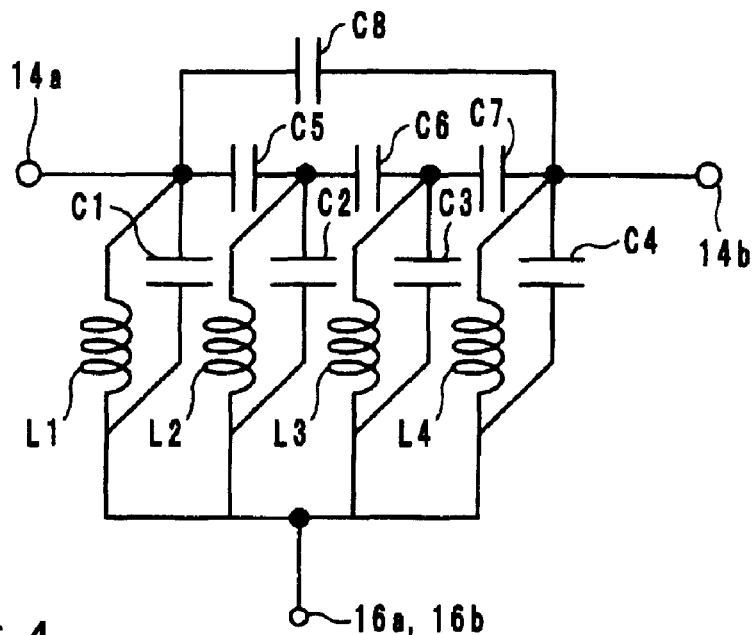
FIG. 3 is an equivalent circuit diagram of an electronic component according to a preferred embodiment of the present invention.
Figure 4:
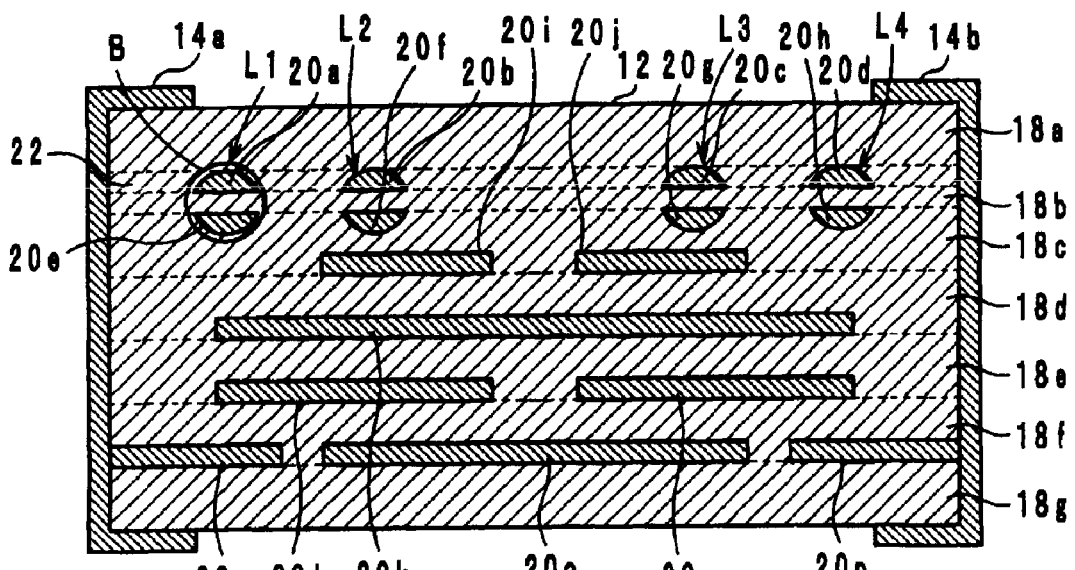
FIG. 4 illustrates a cross section of an electronic component according to a first preferred embodiment, the cross section being taken along line A-A of FIG. 1.

A configuration of an electronic component according to a first preferred embodiment will be described with reference to the drawings. FIG. 1 is an external perspective view of an electronic component 10a, 10b, or 10c according to a preferred embodiment of the present invention. FIG. 2 is an exploded perspective view illustrating a laminated body 12 of the electronic component 10a, 10b, or 10c according to a preferred embodiment of the present invention. FIG. 3 is an equivalent circuit diagram of the electronic component 10a, 10b, or 10c according to a preferred embodiment of the present invention. FIG. 4 illustrates a cross section of the electronic component 10a according to a first preferred embodiment, the cross section being taken along line A-A of FIG. 1. In FIG. 1 to FIG. 4, a stacking direction of the laminated body 12 is defined as a z-axis direction, a long-side direction of the laminated body 12 is defined as an x-axis direction, and a short-side direction of the laminated body 12 is defined as a y-axis direction. The x-axis direction, the y-axis direction, and the z-axis direction are perpendicular or substantially perpendicular to each other.

As illustrated in FIG. 1, the electronic component 10a includes the laminated body 12 and outer electrodes 14a, 14b, 16a, and 16b. The laminated body 12 preferably has a shape of a rectangular parallelepiped, for example. The outer electrodes 14a and 14b are signal electrodes, and extend in the z-axis direction along respective side surfaces located at both ends in the x-axis direction. The outer electrodes 16a and 16b are ground electrodes, and extend in the z-axis direction along respective side surfaces located at both ends in the y-axis direction.

The laminated body 12 will now be described in detail with reference to FIG. 2 and FIG. 3. As illustrated in FIG. 2, the laminated body 12 is preferably formed by stacking insulator layers 18a to 18g in the positive z-axis direction such that they are arranged in this order. The insulator layers 18a to 18g preferably are rectangular ceramic layers (e.g., low temperature co-fired ceramic (LTCC) layers) and are about 1 μm to about 25 μm in thickness, for example. As illustrated in FIG. 2, the laminated body 12 includes coils L1 to L4 and capacitors C1 to C8 (reference numerals of the capacitors C5 to C7 are omitted in FIG. 2). The coils L1 to L4 and the capacitors C1 to C8 are defined by conductor layers 20a to 20p and via hole conductors b1 to b26 described below. Note that the insulator layers 18a to 18g and the conductor layers 20a to 20p are individually referred to using reference numerals with alphabetic letters, and are collectively refer to using reference numerals without alphabetic letters.

The conductor layers 20 and the via hole conductors b1 to b26 are preferably made of Ag, Pd, Cu, Au, or alloy of such metals. The conductor layers 20 are preferably about 1 μm to about 20 μm in thickness, for example. The conductor layers 20a to 20d are linear conductors that extend in the y-axis direction on the insulator layer 18b. The conductor layers 20a to 20d are arranged on the insulator layer 18b, in this order, in the positive x-axis direction. The conductor layers 20e to 20h are linear conductors that extend in the y-axis direction on the insulator layer 18c. The conductor layers 20e to 20h are arranged on the insulator layer 18c, in this order, in the positive x-axis direction.

The via hole conductors b1, b3, b5, and b7 pass through the insulator layer 18b in the z-axis direction to connect respective end portions on the negative side of the conductor layers 20a to 20d in the y-axis direction to respective end portions on the negative side of the conductor layers 20e to 20h in the y-axis direction. Similarly, the via hole conductors b2, b4, b6, and b8 pass through the insulator layer 18b in the z-axis direction to connect respective end portions on the positive side of the conductor layers 20a to 20d in the y-axis direction to respective end portions on the positive side of the conductor layers 20e to 20h in the y-axis direction. Thus, the conductor layer 20a and the conductor layer 20e are connected in parallel, the conductor layer 20b and the conductor layer 20f are connected in parallel, the conductor layer 20c and the conductor layer 20g are connected in parallel, and the conductor layer 20d and the conductor layer 20h are connected in parallel.

The conductor layers 20a and 20e and the via hole conductors b1 and b2 define the coil L1 illustrated in FIG. 2 and FIG. 3. The conductor layers 20b and 20f and the via hole conductors b3 and b4 define the coil L2 illustrated in FIG. 2 and FIG. 3. The conductor layers 20c and 20g and the via hole conductors b5 and b6 define the coil L3 illustrated in FIG. 2 and FIG. 3. The conductor layers 20d and 20h and the via hole conductors b7 and b8 define the coil L4 illustrated in FIG. 2 and FIG. 3.

As illustrated in FIG. 2, the coil L1 and the coil L2 are arranged side by side. Thus, a parasitic capacitance is generated between the coil L1 and the coil L2. The capacitor C5 illustrated in FIG. 3 is defined by this parasitic capacitance. The coil L2 and the coil L3 are arranged side by side. Thus, a parasitic capacitance is generated between the coil L2 and the coil L3. The capacitor C6 illustrated in FIG. 3 is defined by this parasitic capacitance. The coil L3 and the coil L4 are arranged side by side. Thus, a parasitic capacitance is generated between the coil L3 and the coil L4. The capacitor C7 illustrated in FIG. 3 is defined by this parasitic capacitance.

The conductor layers 20i and 20j are arranged on the insulator layer 18d in the x-axis direction. The conductor layer 20k on the insulator layer 18e faces the conductor layers 20i and 20j, with the insulator layer 18d interposed therebetween. Thus, the conductor layer 20i and the conductor layer 20k define the capacitor C2, and the conductor layer 20j and the conductor layer 20k define the capacitor C3.

The via hole conductors b12 and b14 pass through the insulator layer 18c in the z-axis direction to connect respective end portions on the positive side of the conductor layers 20f and 20g in the y-axis direction to the respective conductor layers 20i and 20j. The via hole conductors b11 and b13 are connected to respective end portions on the negative side of the conductor layers 20f and 20g in the y-axis direction, and pass through the insulator layer 18c in the z-axis direction. The via hole conductors b19 and b20 pass through the insulator layer 18d in the z-axis direction to connect the via hole conductors b11 and b13, respectively, to the conductor layer 20k. Thus, as illustrated in FIG. 3, the capacitors C2 and C3 are connected to the coils L2 and L3, respectively, in parallel.

The conductor layer 20k extends to opposite sides of the insulator layer 18e in the positive and negative y-axis directions. Thus, the conductor layer 20k is connected to the outer electrodes 16a and 16b illustrated in FIG. 1. That is, as illustrated in FIG. 3, the coils L2 and L3 and the capacitors C2 and C3 are connected at one end to the outer electrodes 16a and 16b.

The conductor layers 20l and 20m are arranged on the insulator layer 18f in the x-axis direction. The conductor layers 20l and 20m face the conductor layer 20k, with the insulator layer 18e interposed therebetween. Thus, the conductor layer 20k and the conductor layer 20l define the capacitor C1, and the conductor layer 20k and the conductor layer 20m define the capacitor C4.

The via hole conductors b9 and b15 are connected to respective end portions on the negative side of the conductor layers 20e and 20h in the y-axis direction, and pass through the insulator layer 18c in the z-axis direction. The via hole conductors b17 and b21 are connected to the via hole conductors b9 and b15, respectively, and pass through the insulator layer 18d in the z-axis direction. The via hole conductors b23 and b24 pass through the insulator layer 18e in the z-axis direction to connect the via hole conductors b17 and b21 to the conductor layers 20l and 20m, respectively. The via hole conductors b10 and b16 are connected to respective end portions on the positive side of the conductor layers 20e and 20h in the y-axis direction, and pass through the insulator layer 18c in the z-axis direction. The via hole conductors b18 and b22 pass through the insulator layer 18d in the z-axis direction to connect the via hole conductors b10 and b16, respectively, to the conductor layer 20k. Thus, as illustrated in FIG. 3, the capacitors C1 and C4 are connected to the coils L1 and L4, respectively, in parallel. Also, as illustrated in FIG. 3, the coil L1 and the capacitor C1 are connected at one end to the outer electrodes 16a and 16b, through the conductor layer 20k.

The conductor layer 20n on the insulator layer 18g extends to a side in the negative x-axis direction. The via hole conductor b25 passes through the insulator layer 18f in the z-axis direction to connect the conductor layer 20l to the conductor layer 20n. Thus, as illustrated in FIG. 3, the coil L1 and the capacitor C1 are connected at the other end to the outer electrode 14a, through the conductor layer 20n.

The conductor layer 20p on the insulator layer 18g extends to a side in the positive x-axis direction. The via hole conductor b26 passes through the insulator layer 18f in the z-axis direction to connect the conductor layer 20m to the conductor layer 20p. Thus, as illustrated in FIG. 3, the coil L2 and the capacitor C2 are connected at one end to the outer electrode 14b, through the conductor layer 20p.

The conductor layer 20o on the insulator layer 18g faces the conductor layers 20l and 20m, with the insulator layer 18f interposed therebetween. Thus, the conductor layers 20l, 20m, and 20o define the capacitor C8.

The insulator layers 18a to 18g configured as described above are stacked to define the outer electrodes 14a, 14b, 16a, and 16b. The electronic component 10a having a cross section illustrated in FIG. 4 is thus produced. Referring to FIG. 4, an insulator layer 22 having the same thickness as that of each of the conductor layers 20a to 20d, in the z-axis direction, is disposed on the insulator layer 18b. For simplicity of the drawing, the insulator layer 22 is omitted in FIG. 2.

The conductor layer 20a and the conductor layer 20e, which are connected in parallel, allow signals of substantially the same phase to pass therethrough. The conductor layer 20a and the conductor layer 20e are connected to each other, at both ends, by the via hole conductors b1 and b2. Additionally, the conductor layer 20a is connected by the via hole conductor b9 to the conductor layer 20l defining the capacitor C1. In this configuration, signals that pass through the conductor layer 20a and the conductor layer 20e differ in phase by the length of the via hole conductor b1 with respect to the conductor layer 20l. As illustrated in FIG. 4, the conductor layer 20a has a cross section that protrudes in the positive z-axis direction, and the conductor layer 20e has a cross section that protrudes in the negative z-axis direction. That is, the conductor layers 20a and 20e have a semicircular cross section that decreases in thickness in the z-axis direction, with increasing distance from the center thereof in the line width direction. The conductor layers 20a and 20e face each other with the insulator layer 18b interposed therebetween. Thus, as illustrated in FIG. 4, the conductor layers 20a and 20e define a region B in a cross section that is perpendicular or substantially perpendicular to the y-axis direction (i.e., in a cross section perpendicular or substantially perpendicular to a direction in which the linear conductors extend). The region B has a shape which decreases in thickness in the z-axis direction, with increasing distance from the center thereof in the line width direction. In the present preferred embodiment, the region B preferably has an oval shape, for example. The thickness of the region B in the z-axis direction preferably is about 50 μm or more, for example. The conductor layers 20b to 20d and 20f to 20h, which have the same structure as that of the conductor layers 20a and 20e, will not be described in detail.

A method for making the electronic component 10a will be described with reference to the drawings. FIG. 5 is a cross-sectional view illustrating a process of making the electronic component 10a.

First, ceramic green sheets of LTCC for forming the insulator layers 18a to 18g are prepared. A method for producing ceramic green sheets of LTCC is known and thus will not be described here.

Next, the via hole conductors b1 to b26 are formed, as illustrated in FIG. 2, in the ceramic green sheets for forming the insulator layers 18b to 18f. Specifically, via holes are created by irradiating the ceramic green sheets for forming the insulator layers 18b to 18f with a laser beam. Next, a conductive paste of Ag, Pd, Cu, Au, or alloy of such metals is applied to fill the via holes by printing or other suitable process.

Figure 5A:
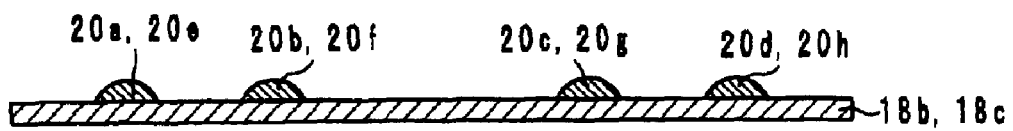
FIGS. 5A-5D are cross-sectional views illustrating a process of making the electronic component illustrated in FIG. 4.

Next, a conductive paste mainly composed of Ag, Pd, Cu, Au, or alloy of such metals is applied onto the ceramic green sheets for forming the insulator layers 18b to 18g by screen printing to form the conductor layers 20a to 20p, as illustrated in FIG. 2. Specifically, as illustrated in FIG. 5A, the conductor layers 20a to 20h are formed on the ceramic green sheets for forming the insulator layers 18b and 18c such that the conductor layers 20a to 20h have a cross section which decreases in thickness in the z-axis direction, with increasing distance from the center thereof in the line width direction. The application of the conductive paste for forming the via hole conductors may be carried out simultaneously with formation of the conductor layers 20a to 20p.

Figure 5B:
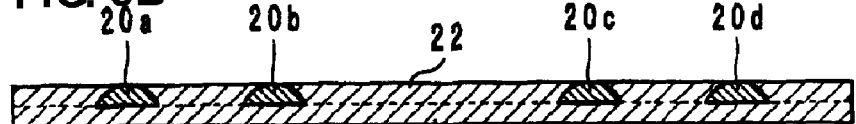

Next, as illustrated in FIG. 5B, a ceramic green layer for forming the insulator layer 22 is formed by applying slurry of insulating material (LTCC) to a principal surface of the ceramic green sheet having the conductor layers 20a to 20d thereon. The principal surface of the ceramic green sheet for forming the insulator layer 18b is thus planarized.

Figure 5C:
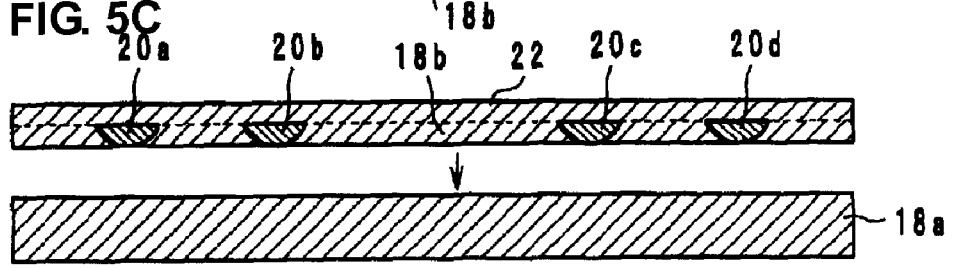
Figure 5D:
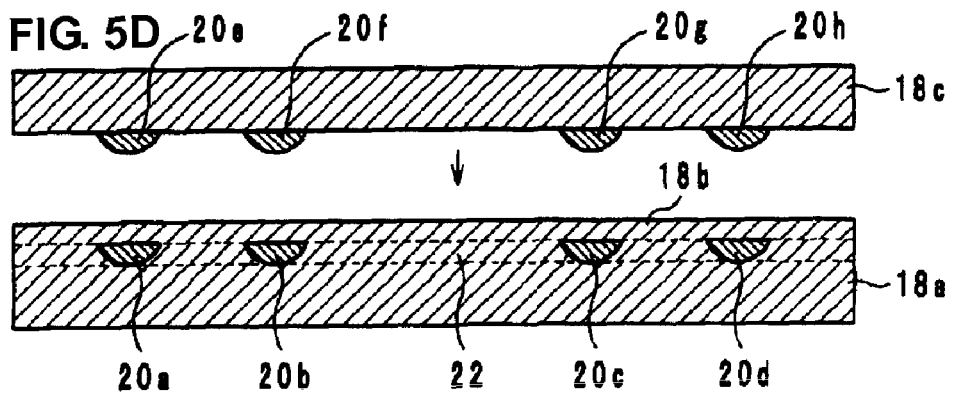

Next, as illustrated in FIG. 5C, the ceramic green sheet for forming the insulator layer 18b is turned upside down, placed on the ceramic green sheet for forming the insulator layer 18a, and temporarily press-bonded thereto. Then, as illustrated in FIG. 5D, the ceramic green sheet for forming the insulator layer 18c is turned upside down, placed on the ceramic green sheet for forming the insulator layer 18b, and temporarily press-bonded thereto. Here, the ceramic green sheet for forming the insulator layer 18c is placed and temporarily press-bonded, with the conductor layers 20e to 20h facing a principal surface of the ceramic green sheet for forming the insulator layer 18b opposite the surface having the conductor layers 20a to 20d thereon, such that the conductor layers 20e to 20h coincide with the corresponding conductor layers 20a to 20d in plan view as viewed in the z-axis direction. By the temporary press bonding, both ends of each of the conductor layers 20e to 20h in the line width direction are pressed downward in FIG. 5D. As a result, as illustrated in FIG. 4, the conductor layers 20e to 20h have a semicircular cross section which protrudes toward the ceramic green sheet for forming the insulator layer 18c. Thus, the conductor layers 20a to 20d and the conductor layers 20e to 20h form regions B having an oval cross section.

Subsequently, the ceramic green sheets for forming the insulator layers 18d to 18g are stacked and temporarily press-bonded, in this order, onto the ceramic green sheet for forming the insulator layer 18c to form a mother laminated body. Then, final press bonding is applied to the mother laminated body by hydrostatic pressure or the like.

Next, the mother laminated body is cut by push cutting to form the laminated body 12 of predetermined dimensions. The laminated body 12, which is unfired, is subjected to debinding and fired.

The fired laminated body 12 can be obtained through the process described above. The laminated body 12 is chamfered by being subjected to barrel processing. Then, an electrode paste composed mainly of silver is applied, by immersion or the like, and baked onto the surface of the laminated body 12. Thus, a sliver electrode for the outer electrodes 14a, 14b, 16a, and 16b is obtained. Then, the outer electrodes 14a, 14b, 16a, and 16b are formed by finally applying Ni—Sn plating to the surface of the silver electrode. The electronic component 10a illustrated in FIG. 1 can thus be completed through the process described above.

In the electronic component 10a configured as described above, the resistance of the coils L1 to L4 is reduced as described below. Specifically, the conductor layers 20a to 20d and the conductor layers 20e to 20h defining the coils L1 to L4 are connected in parallel. Therefore, the resistance of the coils L1 to L4 is lower than that in the case where the coils L1 to L4 are defined only by the conductor layers 20a to 20d.

Additionally, the electronic component 10a can prevent the occurrence of an edge effect in the coils L1 to L4. This will now be described in detail using the conductor layers 20a and 20e as an example. As illustrated in FIG. 4, the outer edges of the conductor layers 20a and 20e define the region B of oval shape. The conductor layers 20a and 20e are connected at both ends by the via hole conductors b1 and b2. Therefore, although the conductor layers 20a and 20b are defined by different ceramic green sheets, signals of substantially the same phase pass therethrough. Thus, the region B defined by the outer edges of the conductor layers 20a and 20e does not have any corners. As a result, a magnetic flux generated around the conductor layers 20a and 20e follows an oval path along the region B, and is less likely to be concentrated on a specific point, as compared to a magnetic flux generated around conductor layers with corners. This means that, as compared to the case of conductor layers with corners, an edge effect is much less likely to occur in the conductor layers 20a and 20e. A computer simulation run by the inventor of the present application shows that, as compared to an electronic component which includes the conductor layers 20a and 20e of rectangular cross section, the resistance of the electronic component 10a can be reduced by about 4% by preventing the occurrence of an edge effect.

A magnetic flux density around the conductor layers 20a to 20h is highest at the center of the conductor layers 20a to 20h in the line width direction. The conductor layers 20a to 20h preferably have a cross section which decreases in thickness in the z-axis direction continuously with increasing distance from the center thereof in the line width direction. This allows the magnetic flux to smoothly move around the conductor layers 20a to 20h from the center to both ends of the conductor layers 20a to 20h in the line width direction. As a result, in the electronic component 10a, the concentration of magnetic flux can be suppressed in the conductor layers 20a to 20h and thus, the occurrence of an edge effect can be effectively prevented.

In the electronic component 10a, the regions B of oval shape can be formed in the conductor layers 20a and 20b in a relatively simple process which involves forming the conductor layers 20a to 20h of semicircular shape and the insulator layer 22. This simplifies the manufacturing process of making the electronic component 10a and reduces the manufacturing cost of the electronic component 10a.

As will be described below, the unloaded Q of the electronic component 10a can be improved by setting the distance between the conductor layers 20 on the positive side in the z-axis direction and the conductor layers 20 on the negative side in the z-axis direction to be less than or equal to half the thickness of the conductor layers 20. Specifically, the inventor of the present application measured the unloaded Q characteristics of the electronic component 10a of the present preferred embodiment. The unloaded Q of a conventional electronic component having a rectangular cross section with a line width of 50 μm and a thickness of 50 μm was 72. On the other hand, in the electronic component 10a illustrated in FIG. 4, the conductor layers 20 on the positive side in the z-axis direction (e.g., the conductor layers 20a to 20d) and the conductor layers 20 on the negative side in the z-axis direction (e.g., the conductor layers 20e to 20h) were set to 50 μm in line width and 25 μm in thickness, and the distance between the conductor layers 20 on the positive side in the z-axis direction and the conductor layers 20 on the negative side in the z-axis direction was varied. When the distance was changed to 0.5 μm, 1.0 μm, 3.0 μm, 5.0 μm, 10 μm, and 15 μm, the unloaded Q of the electronic component 10a was changed to 85.5, 85.5, 83.2, 80.3, 74.7, and 71.3, respectively. This shows that when the distance between the conductor layers 20 on the positive side in the z-axis direction and the conductor layers 20 on the negative side in the z-axis direction (i.e., the thickness of the insulator layer 18b) is set to be less than or equal to half the thickness of the conductor layers 20, it is possible to improve the unloaded Q of the electronic component 10a. The unloaded Q can be expressed as a ratio $-2\alpha/\beta$, where $\alpha$ is an attenuation constant and $\beta$ is a phase constant. Both $\alpha$ and $\beta$ decrease as the distance between the conductor layers 20 on the positive side in the z-axis direction and the conductor layers 20 on the negative side in the z-axis direction decreases. However, the unloaded Q increases probably because the amount of change in the value of $\beta$ associated with a change in the above-described distance is larger.

Second Preferred Embodiment

Figure 6:
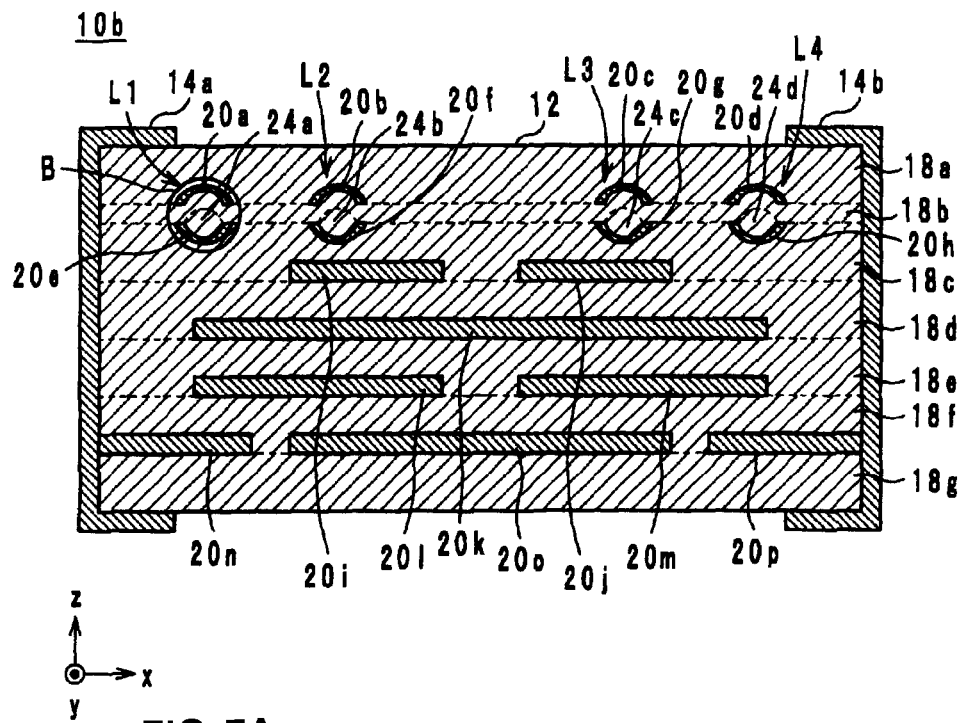
FIG. 6 illustrates a cross section of an electronic component according to a second preferred embodiment, the cross section being taken along line A-A of FIG. 1.

A configuration of an electronic component according to a second preferred embodiment will be described with reference to the drawings. The external perspective view, the exploded perspective view, and the equivalent circuit diagram of FIG. 1 to FIG. 3 are used again for the description. FIG. 6 illustrates a cross section of the electronic component 10b according to the second preferred embodiment, the cross section being taken along line A-A of FIG. 1. In FIG. 6, a stacking direction of the laminated body 12 is defined as a z-axis direction, a long-side direction of the laminated body 12 is defined as an x-axis direction, and a short-side direction of the laminated body 12 is defined as a y-axis direction. The x-axis direction, the y-axis direction, and the z-axis direction are orthogonal to each other.

As illustrated in FIG. 4 and FIG. 6, the electronic component 10a and the electronic component 10b differ in the shape of the conductor layers 20a to 20h. Specifically, whereas the conductor layers 20a to 20h in the electronic component 10a are preferably semicircular in cross section, the conductor layers 20a to 20h in the electronic component 10b are preferably U-shaped in cross section. The electronic component 10b will now be described with a focus on this difference.

Hereinafter, the conductor layers 20a and 20e will be described as an example. As illustrated in FIG. 6, the conductor layer 20a has a cross section in which a flat conductor layer is curved to protrude in the positive z-axis direction. On the other hand, the conductor layer 20e has a cross section in which a flat conductor layer is curved to protrude in the negative z-axis direction. The conductor layers 20a and 20e face each other, with the insulator layer 18b interposed therebetween. Thus, as illustrated in FIG. 6, the conductor layers 20a and 20e define a region B in a cross section perpendicular or substantially perpendicular to the y-axis direction (i.e., in a cross section perpendicular or substantially perpendicular to a direction in which the linear conductors extend). The region B has a shape which decreases in thickness in the z-axis direction, with increasing distance from the center thereof in the line width direction. In the present preferred embodiment, the region B preferably has an oval shape. The conductor layers 20b to 20d and 20f to 20h, which have the same structure as that of the conductor layers 20a and 20e, will not be described in detail. The other configuration of the electronic component 10b is preferably the same or substantially the same as that of the electronic component 10a, and thus will not be described.

In the electronic component 10b having the configuration described above, as in the case of the electronic component 10a, it is possible to reduce the resistance of the coils L1 to L4 and prevent occurrence of an edge effect in the coils L1 to L4.

Figure 7A:
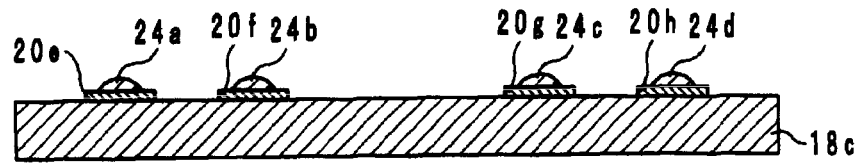
FIGS. 7A-7C are cross-sectional views illustrating a process of making the electronic component illustrated in FIG. 6.
Figure 7B:
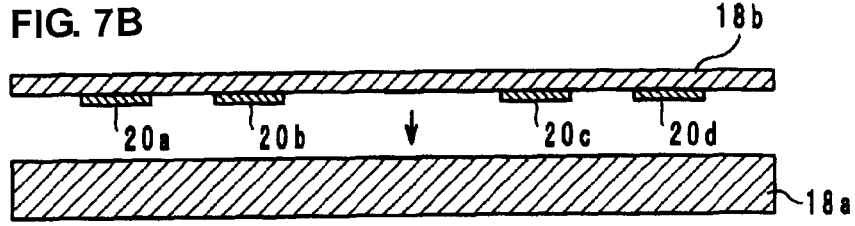
Figure 7C:
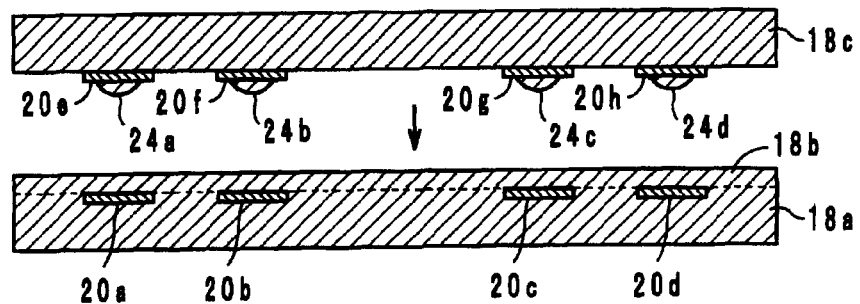

A method for making the electronic component 10b will be described with reference to the drawings. FIGS. 7A-7C are cross-sectional views illustrating a process of making the electronic component 10b.

First, ceramic green sheets of LTCC for forming the insulator layers 18a to 18g are prepared. A method for producing ceramic green sheets of LTCC is known and thus will not be described here.

Next, the via hole conductors b1 to b26 are formed, as illustrated in FIG. 2, in the ceramic green sheets for the insulator layers 18b to 18f. Specifically, via holes are created by irradiating the ceramic green sheets for the insulator layers 18b to 18f with a laser beam. Next, a conductive paste of Ag, Pd, Cu, Au, or alloy of such metals is applied to fill the via holes by printing or the like.

Next, a conductive paste mainly composed of Ag, Pd, Cu, Au, or alloy of such metals is applied onto the ceramic green sheets for forming the insulator layers 18b to 18g by screen printing to form the conductor layers 20a to 20p, as illustrated in FIG. 2. The application of the conductive paste for forming the via hole conductors may be carried out simultaneously with formation of the conductor layers 20a to 20p.

Next, as illustrated in FIG. 7A, ceramic green layers for forming insulator layers 24a to 24d are formed by applying slurry of insulating material (LTCC) to the center portions of the conductor layers 20e to 20h in the line width direction. The ceramic green layers for forming the insulator layers 24a to 24d each are formed into a semicircular shape which protrudes upward.

Next, as illustrated in FIG. 7B, the ceramic green sheet for forming the insulator layer 18b is turned upside down, placed on the ceramic green sheet for forming the insulator layer 18a, and temporarily press-bonded thereto. Then, as illustrated in FIG. 7C, the ceramic green sheet for forming the insulator layer 18c is turned upside down, placed on the ceramic green sheet for forming the insulator layer 18b, and temporarily press-bonded thereto. Here, the ceramic green sheet for forming the insulator layer 18c is placed and temporarily press-bonded, with the conductor layers 20e to 20h facing a principal surface of the ceramic green sheet for forming the insulator layer 18b opposite the surface having the conductor layers 20a to 20d thereon, such that the conductor layers 20e to 20h coincide with the corresponding conductor layers 20a to 20d in plan view as viewed in the z-axis direction. By the temporary press bonding, both ends of each of the conductor layers 20e to 20h in the line width direction are pressed downward in FIG. 7C. Additionally, the center portions of the conductor layers 20a to 20d in the line width direction are pressed by the respective insulator layers 24a to 24d downward in FIG. 7C. Thus, as illustrated in FIG. 6, the conductor layers 20a to 20d have a cross section which is curved to protrude toward the ceramic green sheet for forming the insulator layer 18a. At the same time, the conductor layers 20e to 20h have a cross section which is curved to protrude toward the ceramic green sheet for forming the insulator layer 18c. Thus, the conductor layers 20a to 20d and the conductor layers 20e to 20h define regions B having an oval cross section.

Subsequently, the ceramic green sheets for forming the insulator layers 18d to 18g are stacked and temporarily press-bonded, in this order, onto the ceramic green sheet for forming the insulator layer 18c to form a mother laminated body. Then, final press bonding is applied to the mother laminated body by hydrostatic pressure or the like. The subsequent process of making the electronic component 10b from the mother laminated body will not be described here, as it is the same as that for the electronic component 10a described above.

Figure 8:
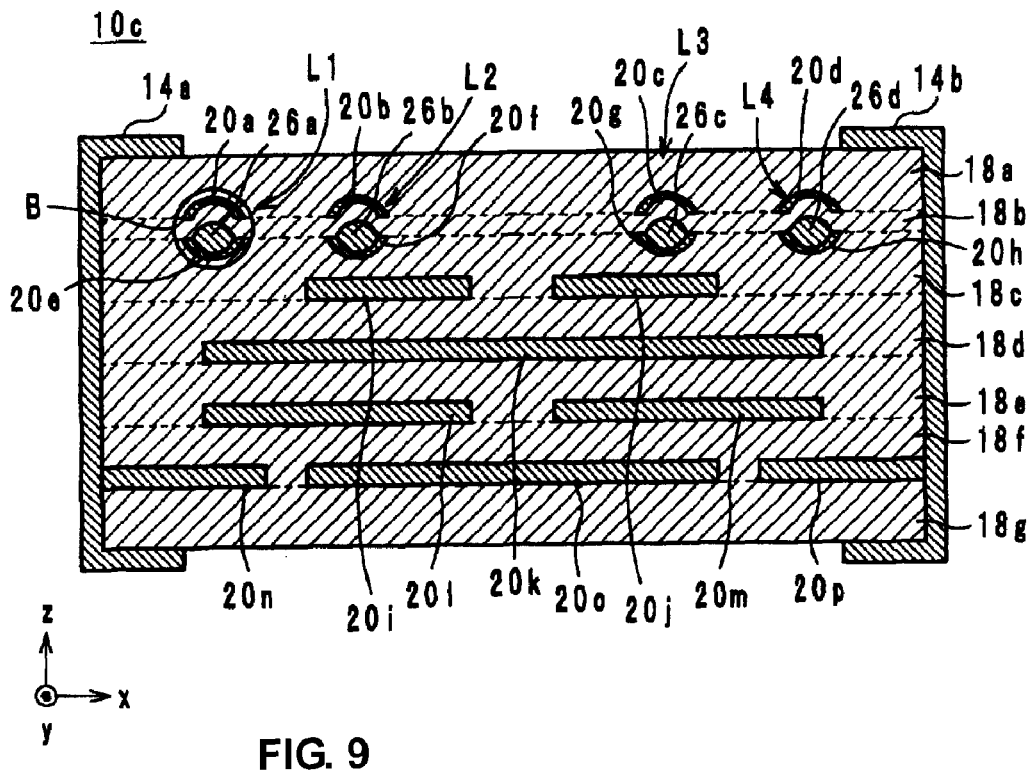
FIG. 8 illustrates a cross section of a modification of the electronic component illustrated in FIG. 6, the cross section being taken along line A-A of FIG. 1.

A modification of the electronic component 10b will be described with reference to the drawing. FIG. 8 illustrates a cross section of the electronic component 10c which is a modification of the electronic component 10b, the cross section being taken along line A-A of FIG. 1.

As illustrated in FIG. 8, the insulator layers 24a to 24d of the electronic component 10b may be replaced with conductor layers 26a to 26d. Since this increases the cross-sectional area of the coils L1 to L4, the resistance of the coils L1 to L4 can be reduced.

Other Preferred Embodiments

The structure of the electronic component according to various preferred embodiments of the present invention is not limited to those of the electronic components 10a to 10c described above, and can be changed within the scope of the present invention.

Figure 9:
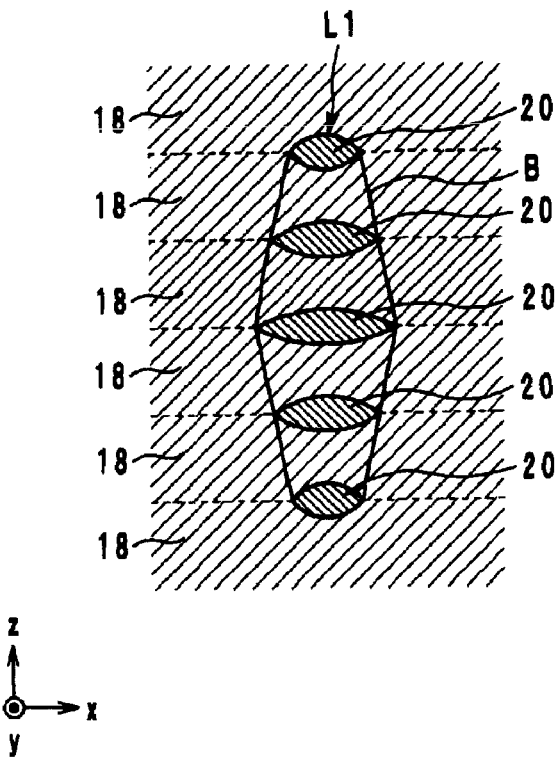
FIG. 9 is an enlarged cross-sectional view of a coil.

Each of the coils L1 to L4 is preferably defined by two conductor layers 20, but may be defined by three or more conductor layers 20. FIG. 9 is an enlarged cross-sectional view of the coil L1.

Referring to FIG. 9, five conductor layers 20 having a flat cross section are stacked in the z-axis direction. The five conductor layers 20 have a shape which increases in line width toward the center thereof in the z-axis direction. Thus, as illustrated in FIG. 9, the plurality of conductor layers 20 define a region B in a cross section perpendicular or substantially perpendicular to the y-axis direction (i.e., in a cross section perpendicular or substantially perpendicular to a direction in which the linear conductors extend). The region B has a shape which decreases in thickness in the z-axis direction, with increasing distance from the center thereof in the line width direction.

Each of the conductor layers 20 illustrated in FIG. 9 has a shape which decreases in thickness in the z-axis direction, with increasing distance from the center thereof in the line width direction. This prevents the occurrence of an edge effect at corners of each conductor layer 20.

In the electronic components 10a to 10c described above, the conductor layers 20 defining each of the coils L1 to L4 are arranged in the z-axis direction, with the corresponding insulator layer 18 interposed therebetween. Alternatively, the conductor layers 20 defining each of the coils L1 to L4 may be arranged in the x-axis direction or the y-axis direction, with the corresponding insulator layer 18 interposed therebetween. That is, within the region B, a plurality of conductor layers 20 may be arranged in the x-axis direction or the y-axis direction.

Although the insulator layers 18 are preferably made of a single material (LTCC) in the electronic components 10a to 10c described above, they may be made of a plurality of materials. Specifically, if there are a plurality of insulator layers 18 within the same region B (i.e., if there are a plurality of insulator layers 18 between the conductor layers 20a to 20d and the conductor layers 20e to 20h), the plurality of insulator layers 18 may be made of materials with different permeabilities. Thus, the inductance of the coils L1 to L4 can be easily set to any values.

Although the conductor layers 20 are preferably made of a single material (LTCC) in the electronic components 10a to 10c described above, they may be made of a plurality of materials. Specifically, a plurality of conductor layers 20 within the same region B may be made of a plurality of different materials. Thus, the inductance and the resistance of the coils L1 to L4 can be easily set to any values.

In the electronic component 10a illustrated in FIG. 4, the thickness of the insulator layer 18a adjacent to the conductor layers 20a to 20d in the positive z-axis direction and the thickness of the insulator layer 18c adjacent to the conductor layers 20e to 20h in the negative z-axis direction may be larger than that of the insulator layer 18b and 18d to 18g. In particular, it is preferable that the insulator layers 18a and 18c each have a larger thickness at portions that overlap, in the z-axis direction, with the respective centers of the conductor layers 20a to 20h in the line width direction. This makes it possible to reduce the amount of magnetic flux that passes through the interfaces between the insulator layers 18 and outside the laminated body 12. Thus, the inductance of the coils L1 to L4 can be improved.

Although the regions B described above are preferably oval in shape, they may be circular in shape, for example.

Preferred embodiments of the present invention are useful when applied to an electronic component and a method for making the electronic component. In particular, preferred embodiments of the present invention are advantageous in that it can reduce the resistance of coils and prevent the occurrence of an edge effect.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
a laminated body including insulator layers stacked on each other in a stacking direction; and
a plurality of coil conductors being linear conductors and defining coils included in the laminated body; wherein
the plurality of coil conductors that face each other, with at least one of the insulator layers interposed therebetween, and allow signals of substantially the same phase to pass therethrough, are arranged to define at least one region in a cross section perpendicular or substantially perpendicular to a direction in which the linear conductors extend, the at least one region having a shape which decreases in thickness in the stacking direction with increasing distance from a center thereof in a line width direction.

2. The electronic component according to claim 1, wherein the at least one region is circular or oval in shape.

3. The electronic component according to claim 1, wherein a first coil conductor having a cross section that protrudes upward in the stacking direction and a second coil conductor having a cross section that protrudes downward in the stacking direction face each other in the stacking direction within the at least one region.

4. The electronic component according to claim 3, wherein the first coil conductor and the second coil conductor each have a cross section which decreases in thickness in the stacking direction with increasing distance from a center thereof in the line width direction.

5. The electronic component according to claim 3, wherein the first coil conductor has a cross section which is curved to protrude upward in the stacking direction; and
the second coil conductor has a cross section which is curved to protrude downward in the stacking direction.

6. The electronic component according to claim 1, wherein the plurality of insulator layers within the same region are made of a plurality of insulating materials.

7. The electronic component according to claim 1, wherein the plurality of coil conductors within the same region are made of a plurality of conductive materials.

8. The electronic component according to claim 3, wherein a thickness of the insulator layer between the first coil conductor and the second coil conductor is less than or equal to half of a thickness of each of the first coil conductor and the second coil conductor.

9. A method for making an electronic component, comprising the steps of:
preparing a first insulator layer and a second insulator layer;
forming a first coil conductor and a second coil conductor on the first insulator layer and the second insulator layer, respectively, the first coil conductor and the second coil conductor being linear conductors and, in a cross section perpendicular or substantially perpendicular to a direction in which the linear conductors extend, each having a cross-sectional structure which decreases in thickness in a stacking direction with increasing distance from the center thereof in a line width direction;
planarizing a principal surface of the first insulator layer including the first coil conductor thereon by applying an insulator layer to the principal surface; and
stacking the second insulator layer on the first insulator layer such that the first coil conductor and the second coil conductor coincide with each other in plan view as viewed in the stacking direction.

10. A method for making an electronic component, comprising the steps of:
preparing a first insulator layer and a second insulator layer;
forming a first coil conductor and a second coil conductor on the first insulator layer and the second insulator layer, respectively, the first coil conductor and the second coil conductor being linear conductors;
forming an intermediate layer at a center of the second coil conductor in a line width direction; and
stacking the second insulator layer on the first insulator layer such that the first coil conductor and the second coil conductor coincide with each other in plan view as viewed in a stacking direction.

11. The method according to claim 10, wherein the intermediate layer is made of an insulating material.

12. The method according to claim 10, wherein the intermediate layer is made of a conductive material.

* * * * *